United States Patent
Sabbah

(10) Patent No.: US 8,870,075 B2
(45) Date of Patent: Oct. 28, 2014

(54) RADIOFREQUENCY COMMUNICATION DEVICE, THE OPERATION OF WHICH IS CONTROLLED BY A VOLUNTARY GESTURE OF THE HOLDER

(71) Applicant: Ask S.A., Sophia Cedex (FR)

(72) Inventor: Elias Sabbah, Valbonne (FR)

(73) Assignee: Ask S.A., Sophia Antipolis (FR)

( * ) Notice: Subject to any disclaimer, the term of this patent is extended or adjusted under 35 U.S.C. 154(b) by 0 days.

(21) Appl. No.: 13/678,016

(22) Filed: Nov. 15, 2012

(65) Prior Publication Data

US 2013/0134224 A1    May 30, 2013

(30) Foreign Application Priority Data

Nov. 15, 2011    (FR) ..................... 11 03471

(51) Int. Cl.
*G06K 19/02* (2006.01)
*G06K 19/077* (2006.01)
*G06K 19/073* (2006.01)
*H03K 17/96* (2006.01)

(52) U.S. Cl.
CPC ...... *G06K 19/0775* (2013.01); *G06K 19/07345* (2013.01); *H03K 17/962* (2013.01); *G06K 19/07783* (2013.01)
USPC .......... 235/488; 235/451; 235/492; 340/10.1; 340/539.12; 340/572.1

(58) Field of Classification Search
USPC ............ 235/488, 451, 492; 340/10.1, 539.12, 340/572.1
See application file for complete search history.

(56) References Cited

U.S. PATENT DOCUMENTS

| | | | |
|---|---|---|---|
| 2006/0266831 A1 | 11/2006 | Kozlay | 235/451 |
| 2007/0164119 A1* | 7/2007 | Liu et al. | 235/492 |
| 2008/0035740 A1 | 2/2008 | Tanner | 235/492 |
| 2008/0256642 A1* | 10/2008 | Hachey | 726/27 |
| 2011/0254665 A1* | 10/2011 | Lindsay et al. | 340/10.5 |
| 2011/0267173 A1* | 11/2011 | Nielsen | 340/10.1 |
| 2012/0229272 A1* | 9/2012 | Jacob et al. | 340/539.12 |

FOREIGN PATENT DOCUMENTS

| | | |
|---|---|---|
| EP | 1 544 787 | 6/2005 |
| FR | 2 828 953 | 2/2003 |

* cited by examiner

*Primary Examiner* — Allyson Trail
(74) *Attorney, Agent, or Firm* — James C. Lydon

(57) ABSTRACT

A contactless portable device including a support layer and a protective layer, the support layer having, on its first side, an antenna made up of a flat winding of turns and a protective layer glued to the first side of the support layer, the antenna having two cuts, two wires and four ends including two connection ends for connecting a chip, and two ends each connected to a contact separated from one another by a narrow space so as to render the antenna open, such that the antenna is closed by flow of a current between the two contacts through the protective layer when a user places a finger on the protective layer where the contacts are located, and enabling communication between the chip and a reader associated with the contactless portable device.

4 Claims, 3 Drawing Sheets

RADIOFREQUENCY COMMUNICATION DEVICE, THE OPERATION OF WHICH IS CONTROLLED BY A VOLUNTARY GESTURE OF THE HOLDER

The present invention concerns a radiofrequency identification device equipped with a means to interrupt operation and specifically concerns a radiofrequency communication device whose operation is controlled by a voluntary gesture of the holder.

Contactless radiofrequency identification devices (RFIDs) are increasingly used for the identification of persons moving about in controlled access zones or transiting from one zone to another. As a result, the market for secure documents of identity document type, such as passports, identity cards or others, is booming. A contactless RFID is a device made up of an antenna and a chip connected to the terminals of the antenna. The chip is not powered and receives its energy by electromagnetic coupling between the antenna of the reader and the antenna of the RFID. Information is exchanged between the RFID and the reader and particularly information stored in the chip that relates to the identification of the holder of the object on which the RFID is located and to the holder's authorization to enter a controlled access zone.

One of the significant problems raised by such contactless devices is the fact that they can be queried by a remote reader unbeknownst to the holder of the device. This problem is all the more serious when sensitive applications such as bank cards, electronic purses and security and identification documents are involved.

One of the means to offset this drawback is to equip the RFID device with a mechanical switch capable of closing the antenna circuit as described in document EP 1 939 792. This means requires a prescriptive and costly modification of the standard manufacturing process of a radiofrequency device which considerably limits their development within the current market.

Figure 1:
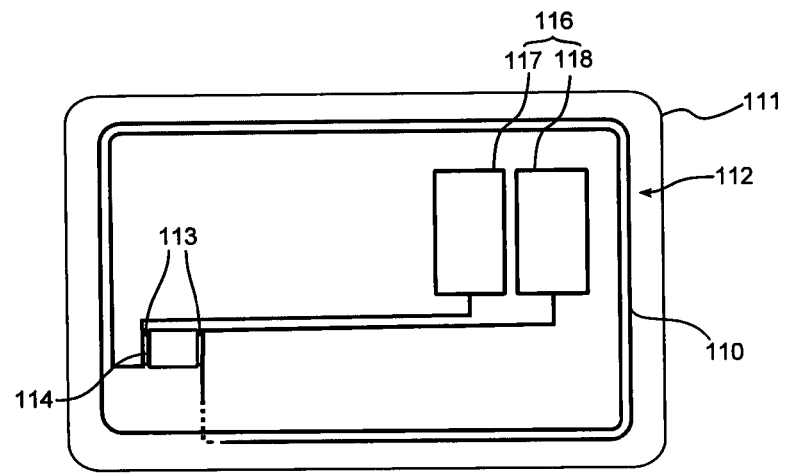
Figure 2:
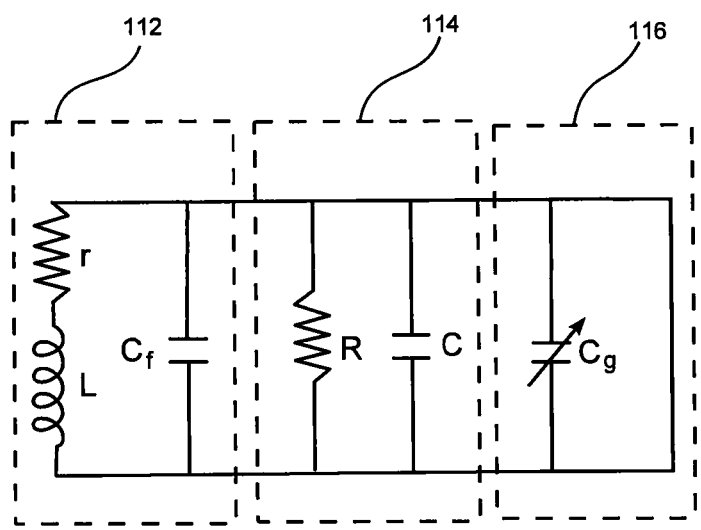

Another means is described in document EP 1 877 964 and illustrated in FIGS. 1 and 2. The RFID 111 shown in FIG. 1 is equipped with a control device 116 featuring capacitive surfaces 117 and 118 which, when covered by the user's finger, enable the transmission of data from the device to the reader. The device includes an electronic module 114 connected to an antenna 112 by two contacts 113. The antenna is also connected to the two capacitive surfaces 117 and 118, each forming one of the two plates of two capacitors, not shown in the figure, the assembly forming the control device 116. By default, the circuit consisting of the chip 114, the antenna 112 and the control device 116 is thus open in the location of the capacitive surfaces 117 and 118.

FIG. 2 represents the equivalent circuit diagram of the device of prior art represented in FIG. 1. The antenna 112 is equivalent to an inductance L, a resistance r and an inter-turn capacitance Cf. The inter-turn capacitance Cf represents the capacitance due the winding of the turns and is created in the space between the turns 110. The control device 116 is equivalent to a variable capacitance Cg. C represents the input capacitance of the chip 114 and R represents the load resistance of the chip 114. The antenna 112, the chip 114 and the control device 116 are connected in parallel.

The device described previously presents a number of drawbacks. It is known that a circuit formed by a chip and an antenna is an oscillating circuit, the optimal operation of which is obtained when the following circuit resonance law is observed:

$$LC\omega^2 = 1 \qquad (1)$$

in which L represents the inductance of the antenna, C represents the total capacitance connected to the antenna and ω the pulse equal to 2 πf, in which f represents the resonance frequency sought for (for example, 13.56 MHz). It follows that the resonance frequency of the circuit $f_0$ is equal to:

$$f_0 = 1/2\pi\sqrt{LC} \qquad (2)$$

By default, the device shown in FIG. 1 must not allow the transmission of data from the chip whose open circuit resonance frequency differs substantially from the data transmission frequency, that is to say 13.56 MHz. To obtain such a frequency, the input capacitance C of the chip being fixed, the inductance L of the antenna must be low in order to increase the value of $f_0$. As a result, the antenna must consist of few turns, leading to low antenna gain and low inter-turn capacitance $C_f$. The product L*C is determined so that the resonance frequency of the open circuit is well above the frequency threshold that allows the exchange of data. For this, the frequency of the open circuit is in the order of 40 MHz. When the user grasps the device 111 and places a finger on the capacitive surfaces 117 and 118 this results in a series connection of the two capacitors in parallel with the antenna. The capacitance obtained by the connection takes into account the capacitance C1 of the first capacitor formed by two plates, one of which is the capacitive surface 117 and the capacitance C2 of the second capacitor formed by two plates, one of which is the capacitive surface 118. The circuit, closed in this manner, must have a frequency $f_1$ near 13.56 Mhz to enable the exchange of data. Its frequency is equal to f1:

$$f_1 = 1/2\pi\sqrt{L.(C+Cg+Cf)}.$$

L and C being fixed, and Cf negligible, the parameter allowing the frequency to drop from 40 MHz to 13.56 MHz is the capacitance Cg of the control device which must have high value***. The capacitance Cg verifies the equation:

$$1/Cg = 1/C1 + 1/C2$$

The capacitance Cg increases the total capacitance of the circuit of the device of prior art and therefore decreases the resonance frequency of the circuit until it reaches the frequency required to allow the exchange of data.

As a result, the value is critical in the operation of the device of prior art. This value is associated with the values of capacitances C1 and C2 of the two capacitors which must be high and is associated with the position of the finger, the force applied and the coupling obtained. Therefore, the operation of the device of prior art is not homogenous as it depends on the manner in which the user grasps and activates the control device. This can slow down and disrupt the reading of the card in real-life situations, such as during an access control or identity check.

Furthermore, as can be seen in the circuit diagram in FIG. 2, when the finger is not placed on the card, the circuit is opened in the location of the capacitors but the antenna 112 and the chip 114 continue to form a closed circuit. The RFID can thus always receive power from the reader as the chip is always connected to the antenna. This means that data communication between the RFID and the reader remains possible and will depend on the power emitted by the reader.

Another drawback of devices of prior art resides in the difficulty in implementing them industrially. In fact, the creation of a switch or the insertion of electrical components in the thickness of the contactless device increases the number of steps in the manufacturing process and thus consequently increases the cost price of the final product.

This is why the purpose of the invention is to provide a radiofrequency device which mitigates the aforementioned drawbacks, the optimal operation of which is initiated by the holder, applying an even and deliberate action on the card.

The object of the invention is thus a contactless portable device consisting of at least two layers,
- a support layer comprising, on its first side, an antenna formed by a flat winding of turns that cross by means of an electrically insulating bridge,
- a protective layer glued to the first side of the support layer, the antenna, featuring two cuts and consisting of two wires and four ends, including two connection ends for connecting a chip.

According to the main characteristic, the antenna includes two ends, each extended by a contact, these contacts not being in contact with one another and being separated by a narrow space so as to render the antenna open,
- the antenna being closed by the flow of current between the two contacts through the protective layer when a user places a finger on the protective layer where the contacts are located, thus enabling communication between the chip and the reader associated with the contactless portable device.

Figure 3:
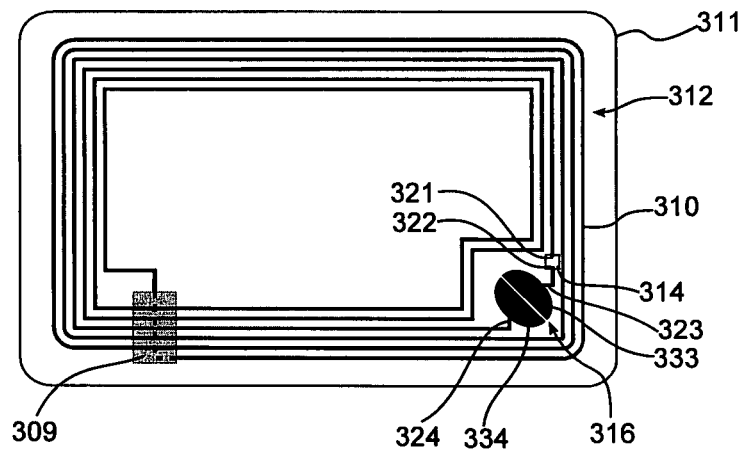
Figure 4:
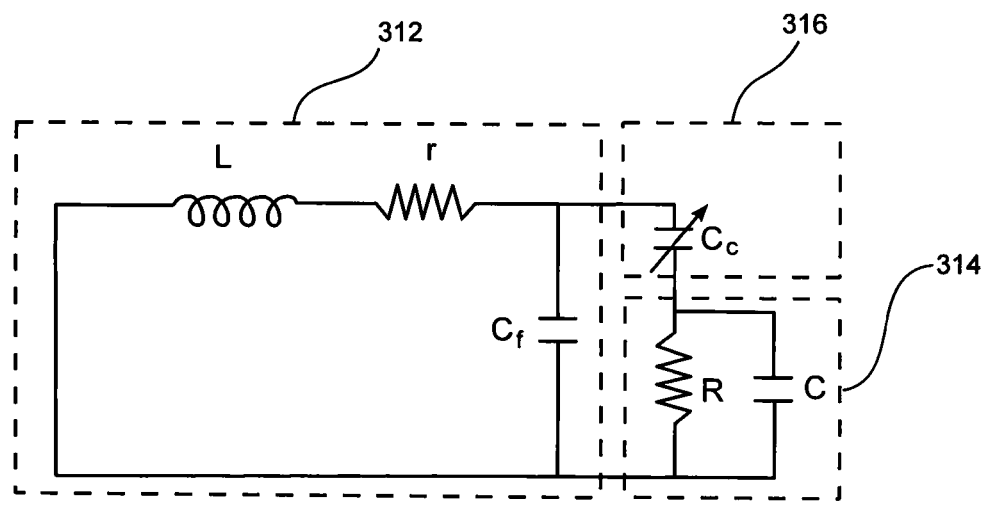
Figure 5:
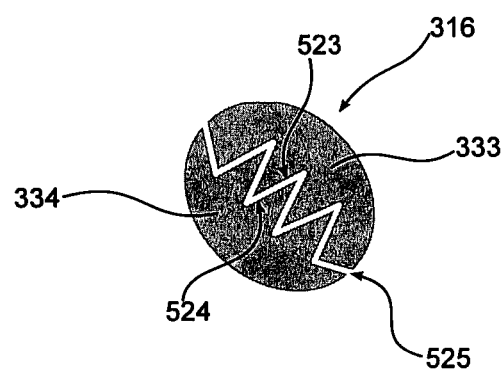

The purposes, objects and characteristics of the invention will become more apparent from the following description when taken in conjunction with the accompanying drawings in which:

FIG. 1 represents the device of prior art,

FIG. 2 represents the equivalent circuit diagram of the device of prior art represented in FIG. 1, FIG. 3 represents a general diagram of the radiofrequency device according to the invention, FIG. 4 represents the equivalent circuit diagram of the radiofrequency device according to the invention represented in FIG. 3, FIG. 5 represents a detailed diagram of the sensitive area equipping the device according to the invention.

The radiofrequency device according to the invention is a contactless device designed to communicate remotely with a reader. The device according to the invention advantageously applies to a contactless card or ticket in standard smart card format or to a passport cover, referred to as an "inlay". However, the device described here may be another format without deviating from the scope of the invention. The device according to the invention includes a support layer 311 represented in FIG. 3. The support layer 311 is made of paper, Teslin-type synthetic paper or other material such as polycarbonate, PET or PVC. A circuit featuring an antenna 312, a chip 314 and a sensitive zone 316 is made on a first side of the support layer 311. The antenna, preferably planar, is made by screen printing, flexography, rotogravure, offset printing or inkjet printing with epoxy type conductive ink loaded with conductive particles such as silver or gold or with a conductive polymer, for example. The antenna may also be made according to another technique such as aluminium etching. The antenna is formed by a flat winding of turns 310 that cross without short circuiting, passing above and below an electrically insulating layer or bridge 309. The antenna 312 features at least two turns 310. However, as the antenna is adjusted to the chip, the number of turns depends on the type of chip used. Preferably, the turns are constantly spaced between 0.1 mm and 1 mm apart, depending on the technology used. The antenna is coupled in two locations so that it features two cuts, two wires and four ends.

The antenna 312 features two connection ends 321 and 322 to which the chip 314 is connected. The chip 314 is connected according to a known process such as the "flip-chip" connection method or according to other processes. The antenna also features two other ends 323 and 324, each extended by a contact 333 and 334. The two contacts 333 and 334 form the sensitive zone 316 of the antenna. The two contacts are made according to the same printing or etching procedure as antenna 312 and are located on the support layer 311, thus in the same plane as the antenna 312. The contacts are preferably manufactured at the same time as the antenna. They are made of the same material as the antenna and thus form an integral part of the latter. The two contacts, located in the same plane, are not in contact with one another and are separated by a space between 0.1 mm and 1.5 mm. The contact 333 extends the end 323 of the antenna, which means that the contact 333 is connected to the end 323 of the antenna, in the same manner as contact 334 is connected to the end 324 of the antenna. The length of the first antenna wire located between the connection end 322 and the end 323 of the antenna is as short as possible; this length must not exceed 10% of the total length of the antenna and is preferably less than 5%, thereby preventing the supply of power to the chip when the circuit is open and, as a result, preventing any data transmission between the contactless device and the reader. The second antenna wire is located between the connection end 321 of the chip 314 and the end 324 of the antenna. The bridge 309 is located on the antenna in the middle of the second wire which allows the antenna to be adapted to the chip in order to maximise energy transfer when the circuit is closed and thus to optimise data transmission between the contactless device and the reader.

The support layer 311 is covered by at least a protective layer in order to protect the circuit and to finalise the device. In the case of a ticket, this first layer can be made of paper, synthetic paper, PVC, PC, etc. In the case of a card, the antenna support layer is inserted between two protective layers made of a plastic material (PVC, PET, PC) forming the upper and lower card bodies and then heat bonded by hot-lamination under pressure. Thus, the sensitive zone is placed between two layers so as to be electrically isolated from the outside. In the case of a passport inlay, this first layer is made of paper or Teslin-type synthetic paper.

FIG. 4 represents the equivalent diagram of the electronic circuit represented in FIG. 3. The circuit includes the antenna 312, the sensitive zone 316 and the chip 314. The antenna 312 is equivalent to an inductance L, a resistance r and an inter-turn capacitance Cf. The inter-turn capacitance Cf is created in the space between the turns 310 and represents the capacitance due to the winding of the turns. The sensitive zone 316 is equivalent to a variable capacitance Cc. C represents the input capacitance of the chip and R represents the load resistance of the chip. The chip 314 is thus in series with the sensitive zone 316.

By default, the sensitive zone 316 is open, which corresponds to a capacitance Cc value of nearly zero. As can be seen in the equivalent circuit diagram of FIG. 4, the branch of the circuit featuring the chip is thus open by default. As a result, the chip receives no energy when the antenna is open. No exchange of information is thus possible between the card and the associated reader. Unlike the device of prior art, the resonance frequency value of the open circuit is not crucial in preventing the exchange of data. On the other hand, the resonance frequency value of the device according to the invention may be less than 20 MHz while preventing the operation of the card without a finger being placed on the sensitive zone. By default, the resonance frequency of the device according to the invention is equal to:

$$f_0 = 1/2\pi\sqrt{L.Cf} \qquad (3)$$

As can be seen in equation (3), only the inter-turn capacitance value intervenes in the resonance frequency value of the device according to the invention. So, whatever the resonance frequency value, there is no exchange between the device according to the invention and an associated reader.

An embodiment of the sensitive zone 316 according to the invention is shown in FIG. 5. The dimensions of the sensitive zone are about the size of a thumb. Preferably, the sensitive zone is elliptical in shape although can be rectangular, square or parallelepipedal without deviating from the scope of the invention. The sensitive zone is formed by two separate contacts 333 and 334 nested in one another although having no zones in contact as they are separated by a narrow space 525. The space 525 is defined by the opposite edges 523 and 524 of the two separate contacts 333 and 334. These edges are preferably parallel so that the space 525 has constant width. This width is in the order of one millimetre and is preferably between 0.1 mm and 1.5 mm.

The placement of the card holder's finger on the sensitive zone 316 causes current to flow between the two parts 521 and 522 as the finger offers low resistance, and an increase in the capacitance Cc of the sensitive zone 316. The sensitive zone 316 is thus in closed position, the circuit consisting of the chip 314, the antenna 312 and the sensitive zone is thus closed, thereby enabling communication between the chip and a reader associated with the contactless portable device. The resonance frequency is thus equal to:

$$f_0 = 1/2\pi\sqrt{L.(Cf + k*C)}. \qquad (4)$$

where k is a coefficient associated with the shape of the sensitive zone and the capacitance Cc of the sensitive zone.

As can be seen in equation (4), when the device according to the invention is actuated by placing a finger, the capacitance of the chip also participates in obtaining the resonance frequency in addition to the inter-turn capacitance. As a result, the capacitance of the chip is critical in the RF function of the device.

The device according to the invention presents the advantage of not having a mechanical interface nor assemblies of mobile mechanical parts such as those that can be seen in a switch. The sensitive zone does not include any added element such as a sensor. The device according to the invention has no conductive surface on its external surface. The sensitive zone being made at the same time as the antenna on the antenna support layer, the sensitive zone is completely dissimulated in the device, under the protective layer.

The invention claimed is:

1. A contactless portable device consisting of at least two layers,
    a support layer comprising, on its first side, an antenna formed by a flat winding of turns that cross by means of an electrically insulating bridge,
    a protective layer glued to the first side of the support layer, said antenna featuring two cuts and consisting of two wires and four ends, including two connection ends for connecting a chip;
    wherein said antenna includes two ends, each extended by a contact, the two contacts not being in contact with one another, being separated by a narrow space so as to render the antenna open, and being located in the same plane as the antenna,
    wherein said antenna is closed by the flow of current between the two contacts through the protective layer when a user places a finger on the protective layer where the contacts are located, thus enabling communication between the chip and the reader associated with the contactless portable device, and
    wherein a length of a first antenna wire located between the connection end of the chip and an end is less than 10% of a total length of the antenna, thereby preventing the supply of power to the chip when the circuit is open and, as a result, preventing any data transmission between the contactless device and the reader.

2. The device according to claim 1 in which said space has a constant width between 0.1 mm and 1.5 mm.

3. The device according to claim 1, wherein said insulating bridge is located on the antenna circuit in the centre of the second wire located between the connection end of the chip and the end of the antenna which allows the antenna to be adapted to the chip in order to maximise energy transfer when the circuit is closed and thus to optimise data transmission between the contactless device and the reader.

4. The device according to claim 1, wherein said two contacts form a sensitive zone that is elliptical in shape.

* * * * *

UNITED STATES PATENT AND TRADEMARK OFFICE
CERTIFICATE OF CORRECTION

| | | |
|---|---|---|
| PATENT NO. | : 8,870,075 B2 | Page 1 of 1 |
| APPLICATION NO. | : 13/678016 | |
| DATED | : October 28, 2014 | |
| INVENTOR(S) | : Elias Sabbah | |

It is certified that error appears in the above-identified patent and that said Letters Patent is hereby corrected as shown below:

IN THE SPECIFICATION:

Col. 5, lines 18-19, replace "parts 521 and 522" with -- separate contacts 333 and 334 --.

Signed and Sealed this
Twenty-fifth Day of August, 2015

Michelle K. Lee
*Director of the United States Patent and Trademark Office*